United States Patent
Gardner

[19]

[11] Patent Number: 6,069,387
[45] Date of Patent: May 30, 2000

[54] LIGHTLY DOPED DRAIN FORMATION INTEGRATED WITH SOURCE/DRAIN FORMATION FOR HIGH-PERFORMANCE TRANSISTOR FORMATION

[75] Inventor: Mark I. Gardner, Cedar Creek, Tex.

[73] Assignee: Advanced Micro Devices, Inc., Sunnyvale, Calif.

[21] Appl. No.: 09/055,648

[22] Filed: Apr. 6, 1998

[51] Int. Cl.[7] .............................. H01L 29/76; H01L 29/94
[52] U.S. Cl. ........................... 257/344; 257/408; 257/411
[58] Field of Search ..................................... 257/344, 346, 257/336, 408, 411

[56] References Cited

U.S. PATENT DOCUMENTS 5,614,739  3/1997  Abrokwah et al. ...................... 257/192
5,767,531  6/1998  Yoshinouchi .............................. 257/72
5,929,493  7/1999  Gardner et al. .......................... 257/401
5,969,394  10/1999  Gardner et al. .......................... 257/401

*Primary Examiner*—John Guay
*Attorney, Agent, or Firm*—Kevin L. Daffer; Conley, Rose & Tayon

[57] ABSTRACT

An integrated circuit fabrication process is provided for forming a transistor in which the source/drain areas are formed simultaneously with the lightly doped drain areas. A gate electrode including a high-K gate dielectric and a gate conductor is formed upon a semiconductor substrate. The high-K gate dielectric is then selectively narrowed relative to the gate conductor. The source/drain areas and lightly doped drain areas are formed using a single impurity implant without the need for sidewall spacers on the gate electrode. A metal silicide layer may be formed across upper surfaces of the gate conductor and source/drain areas, also without the need for sidewall spacers on the gate electrode.

7 Claims, 3 Drawing Sheets

LIGHTLY DOPED DRAIN FORMATION INTEGRATED WITH SOURCE/DRAIN FORMATION FOR HIGH-PERFORMANCE TRANSISTOR FORMATION

BACKGROUND OF THE INVENTION

1. Field of the Invention

This invention relates to integrated circuit fabrication and, more particularly, to a method for simultaneously forming lightly doped drain areas and source/drain areas for high-performance transistors.

2. Description of the Related Art

Because of the increased desire to build faster and more complex integrated circuits, it has become necessary to reduce the transistor threshold voltage, $V_T$. Several factors contribute to $V_T$, one of which is the effective channel length ("$L_{eff}$") of the transistor. The initial distance between the source-side junction and the drain-side junction of a transistor is often referred to as the physical channel length, L. However, after implantation and subsequent diffusion of the junctions, the actual distance between junctions becomes less than the physical channel length and is often referred to as the effective channel length. In VLSI designs, as the physical channel length decreases, so too must $L_{eff}$. Decreasing $L_{eff}$ reduces the distance between the depletion regions associated with the source and drain of a transistor. As a result, less gate charge is required to invert the channel of a transistor having a short $L_{eff}$. Accordingly, reducing L, and hence $L_{eff}$, can lead to a reduction in the threshold voltage of a transistor. Consequently, the switching speed of the logic gates of an integrated circuit employing transistors with reduced $L_{eff}$ is faster, allowing the integrated circuit to quickly transition between logic states (i.e., operate at high frequencies). Minimizing L also improves the speed of integrated circuits including a large number of individual transistors because the larger drain current associated with a short channel length can drive the adjoining transistors into saturation more quickly. Minimizing L is, therefore, desirable from a device operation standpoint.

In addition, minimizing L is desirable from a manufacturing perspective because a smaller area of silicon is required to manufacture a transistor having a smaller length. By minimizing the area required for a given transistor, the number of transistors available for a given area of silicon increases, with a corresponding increase in the circuit complexity that can be achieved on the given area of silicon. As layout densities increase, however, the problems associated with fabrication of transistors are exacerbated. N-channel devices are particularly sensitive to so-called short-channel effects ("SCE"). SCE become a predominant problem whenever $L_{eff}$ drops below approximately 1.0 µm.

A problem related to SCE and the subthreshold currents associated therewith is the problem of hot-carrier effects ("HCE"). HCE are phenomena by which the kinetic energy of the carriers (holes or electrons) is increased as they are accelerated through large potential gradients and subsequently become trapped within the gate dielectric. The greatest potential gradient, often referred to as the maximum electric field ("$E_m$"), occurs near the drain during saturated operation. More specifically, the electric field is predominant at the lateral junction of the drain adjacent the channel. The electric field at the drain primarily causes electrons in the channel to gain kinetic energy and become "hot." As hot electrons travel to the drain, they lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor.

To overcome the problems of sub-threshold current and threshold shift resulting from SCE and HCE, an alternative drain structure known as lightly doped drain ("LDD") is commonly used. The purpose of the LDD is to absorb some of the potential into the drain and thus reduce $E_m$. LDD areas and source/drain areas are conventionally formed sequentially. LDD areas are typically formed self-aligned to sidewall surfaces of the gate conductor by implanting a light concentration of dopant ions into the semiconductor substrate. The light implant dose serves to produce a lightly doped section within the junction at the gate edge near the channel. Spacers are then formed adjacent the sidewalls of the gate conductor and a second implant of dopant species forwarded into the semiconductor substrate to form source/drain areas a lateral spaced distance from the gate conductor. The second implant is performed at a higher concentration than the first implant. The second implant is also performed at a higher energy than the first implant, so that the peak concentration of the source/drain areas resides at a depth greater than the peak concentration of the lightly doped drain areas. As a result, a dopant gradient (i.e., "graded junction") occurs at the interface between the source and channel as well as between the drain and channel.

Associated with the conventional method of lightly doped drain and source/drain formation, however, are several disadvantages. With two impurity implants separated by a spacer formation step, the fabrication process is complicated and time-consuming. The multiplicity of steps also allows increased opportunity for introduction of unwanted contaminants into the device being fabricated during transfer between processes. Further, the size of the spacers formed according to the conventional method is fairly fixed. Thus, as the channel length of transistors is decreased, the lateral dimension of the spacers, and thus of the lightly doped drain areas masked by them, increases as a proportion of the channel length. Unfortunately, the addition of an LDD implant adjacent the channel adds capacitance and resistance to the source/drain pathway. This added resistance, generally known as parasitic resistance, can have many deleterious effects. First, parasitic resistance can decrease the saturation current (i.e., current above threshold). Second, parasitic capacitance can decrease the overall speed of the transistor.

It would therefore be desirable to derive a method for fabricating a transistor in which the need for sidewall spacers is eliminated. Eliminating the need for spacers may facilitate fabrication of sub-micron gate conductors as well as allow increased control of lightly doped drain dimensions, thus minimizing parasitic resistance in transistors having small lateral dimensions. In addition, deriving a method for fabricating lightly doped drain areas simultaneously with source/drain areas would be desirable, in that such a method may simplify the manufacturing process and improve device quality.

SUMMARY OF THE INVENTION

The problems outlined above are in large part solved by the technique hereof for fabricating a transistor in which the lightly doped drain areas are formed simultaneously with the source/drain areas. In one embodiment, a layer of silicon nitride ("nitride") is formed upon a semiconductor substrate. The nitride layer may serve as an etch-stop layer for subsequent processing steps and may be formed by deposition from, e.g., a silane- and nitrogen-bearing source. A layer of a high-K dielectric material is preferably arranged upon the nitride layer. For purposes of this application, a "high-K dielectric material" is a material having a dielectric constant K greater than approximately 3.8, the K value of silicon dioxide. Examples of high-K dielectrics include barium strontium titanate, lead lanthanum zirconate titanate, barium zirconate titanate, cerium oxide, tin oxide, and tantalum oxide. The high-K dielectric layer may be formed using, e.g., chemical vapor deposition ("CVD") or spin-on deposition.

A conductive gate layer is subsequently deposited across the high-K dielectric layer. The conductive gate layer is preferably polysilicon which has been chemically-vapor deposited ("CVD") from, e.g., a silane source. However, the conductive gate layer may include other semiconductive or conductive materials, such as tungsten and aluminum. Following formation of the dielectric and conductive gate layers, a gate electrode having opposed sidewall surfaces may be defined by etching portions of the conductive gate layer and the dielectric layer not covered by a patterned photoresist layer using, e.g., a directional plasma etch technique.

Following the directional etch, the lateral dimension of the gate dielectric may be narrowed using an isotropic etch selective for the gate dielectric material. Preferably, etching narrows the lateral dimension of the gate dielectric by between approximately 10% and 20% of the overall lateral gate dimension on each side (i.e., the lateral dimension of the gate dielectric after etching is preferably between approximately 60% and 80% of the lateral dimension of the gate conductor).

An implant impurity distribution may then be forwarded into the semiconductor substrate, with the gate dielectric and the gate conductor serving as implant masks to block implantation of impurity ions into the channel region underlying the gate. Heavily doped source/drain regions are preferably formed self-aligned with sidewall surfaces of the gate conductor at a first depth within the semiconductor substrate. The gate conductor preferably also serves as a mask to partially block implantation of impurity ions into regions of the semiconductor substrate immediately adjacent sidewall surfaces of the gate dielectric. As a result, lightly doped drain areas may be formed self-aligned to the sidewalls of the gate dielectric at a second depth less than the first depth within regions of the semiconductor substrate laterally adjacent the gate dielectric.

Following formation of the lightly doped drain areas and the source/drain areas, a refractory metal (e.g., titanium or cobalt) may be formed across upper surfaces of the source/drain regions and the upper surface of the gate conductor. The deposited refractory metal may be exposed to a form of radiation capable of increasing the temperature of the refractory metal to above, e.g., 600° C. Raising the temperature of the refractory metal serves to initiate reaction between metal atoms and silicon atoms of the polysilicon gate conductor and the source/drain areas. Any unreacted refractory metal which remains may be etched away using, e.g., a wet etch highly selective to the metal. The resulting metal silicide has a relatively low resistivity and serves as a self-aligned contact region across the source/drain areas and the gate conductor.

BRIEF DESCRIPTION OF THE DRAWINGS

Other objects and advantages of the invention will become apparent upon reading the following detailed description and upon reference to the accompanying drawings in which.

Figure 1:
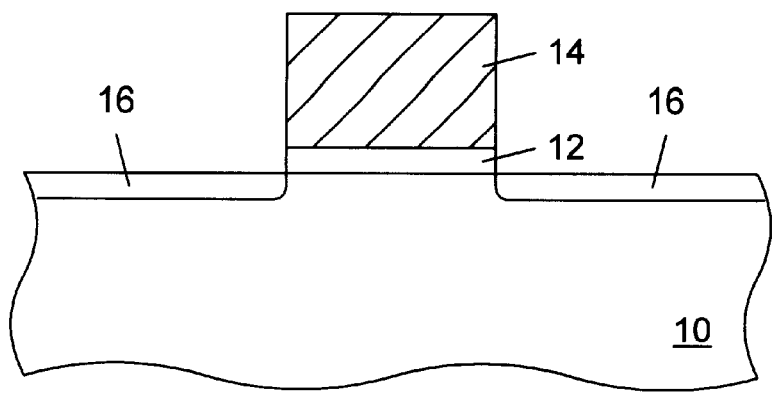
FIG. 1 is a partial cross-sectional view of a semiconductor topography formed according to the prior art, wherein lightly doped drain areas have been formed self-aligned with sidewall surfaces of a conductive gate structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 2:
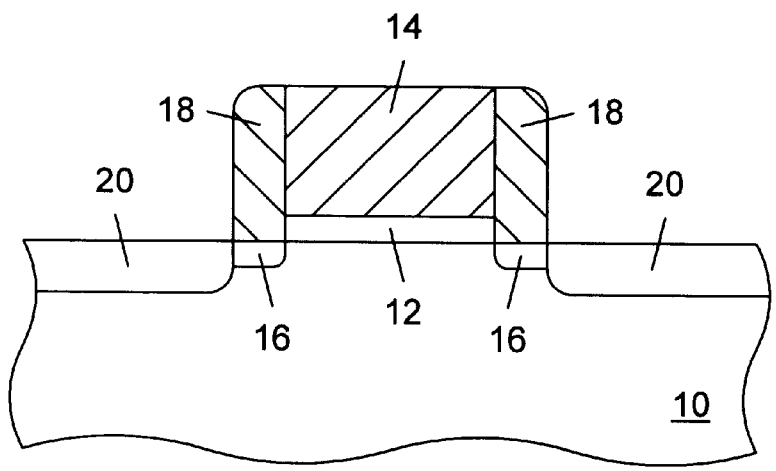
FIG. 2 is a partial cross-sectional view of the semiconductor topography according to a processing step subsequent to FIG. 1, wherein sidewall spacers have been formed adjacent the conductive gate structure and source/drain areas have been formed self-aligned with the edges of the sidewall spacers.
Figure 3:
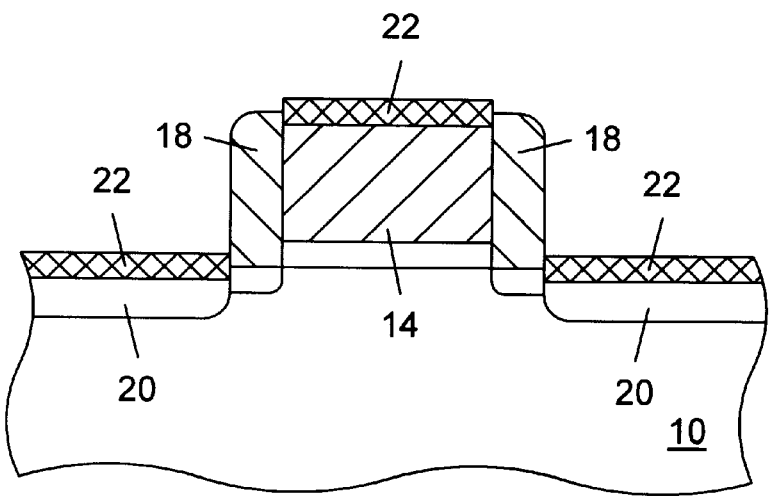
FIG. 3 is a partial cross-sectional view of the semiconductor topography according to a processing step subsequent to FIG. 2, wherein a metal silicide has been formed across upper surfaces of the source/drain areas and the gate conductor.

Turning now to the drawings, FIGS. 1–3 illustrate a process by which a transistor is typically formed using methods well known in the art. FIG. 1 depicts a semiconductor substrate 10 upon which a gate dielectric 12 and a gate conductor 14 have been formed. Lightly doped drain areas 16 have been implanted into semiconductor substrate 10 self-aligned with sidewall surfaces of gate conductor 14. Following formation of lightly doped drain areas 16, a dielectric material is deposited across exposed surfaces of semiconductor substrate 10, gate dielectric 12, and gate conductor 14, and an anisotropic etch is then used to preferentially remove the dielectric material from horizontal surfaces of the semiconductor topography while retaining the dielectric material on vertical surfaces. The retained material forms spacers 18 adjacent sidewall surfaces of the gate structure (FIG. 2).

Following formation of sidewall spacers 18, source/drain areas 20 are formed self-aligned with the edges of the sidewall spacers a lateral spaced distance from gate conductor 14. A refractory metal may be deposited across the gate conductor and the semiconductor substrate. The metal may be reacted with silicon in, e.g., the gate conductor and exposed portions of the semiconductor substrate to form a metal silicide. As illustrated in FIG. 3, metal silicide 22 may be formed on upper surfaces of gate conductor 14 and source/drain areas 20 and unreacted metal removed from sidewall spacers 18.

Figure 4:
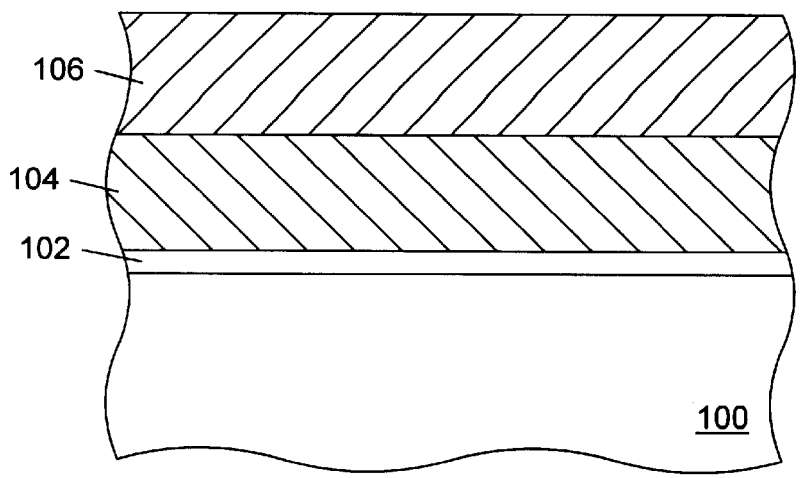
FIG. 4 is a partial cross-sectional view of a semiconductor topography according to the present invention in which a layer of silicon nitride is deposited across a semiconductor substrate, a layer of a high-K dielectric material is deposited across the silicon nitride, and a layer of a conductive gate material is deposited across the high-K dielectric material.

FIG. 4 illustrates a method for forming a transistor according to the present invention, in which a layer 102 of silicon nitride ("nitride") has been formed upon semiconductor substrate 100. Semiconductor substrate 100 may comprise single crystalline silicon and may include dielectric isolation regions arranged a spaced distance apart (not shown) for dielectrically isolating ensuing active areas. Preferably, substrate 100 is slightly doped with n-type or p-type impurities. Nitride layer 102 may be formed by deposition from, e.g., a silane- and nitrogen-bearing source.

A layer 104 of a dielectric material having a dielectric constant K greater than approximately 3.8 (i.e., a "high-K dielectric," with a K value greater than the K value of silicon dioxide) is arranged upon nitride 102. Examples of high-K dielectrics include barium strontium titanate, lead lanthanum zirconate titanate, barium zirconate titanate, cerium oxide, and tin oxide. High-K dielectric layer 104 may be formed using, e.g., chemical vapor deposition ("CVD") or spin-on deposition. Dielectric layer 104 may have a thickness ranging from about 200 Å to 1500 Å, depending somewhat on the K value of the dielectric and the desired threshold voltage of the ensuing transistor.

Figure 5:
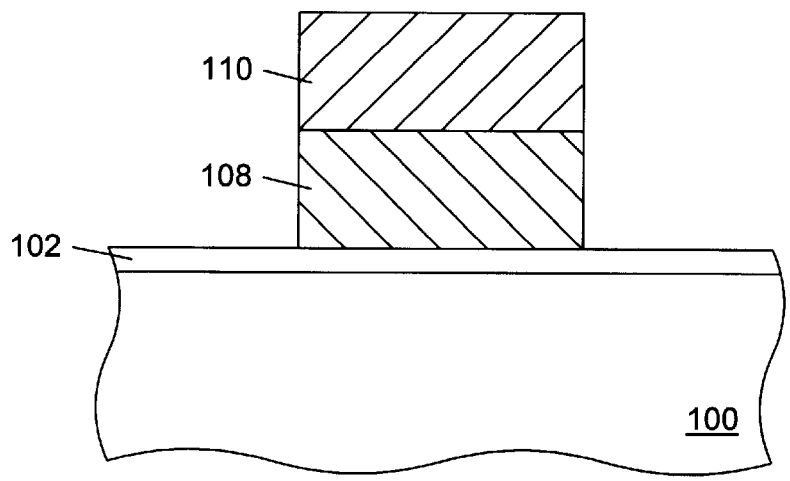
FIG. 5 is a partial cross-sectional view of a semiconductor topography according to a processing step subsequent to FIG. 4, wherein the gate conductive material and the high-K dielectric material have been patterned to form a gate electrode aligned over a channel region of the semiconductor substrate.

A conductive gate layer 106 is deposited across dielectric layer 104. Conductive gate layer 106 is preferably polysilicon which has been chemically-vapor deposited ("CVD") from, e.g., a silane source. The composition of conductive gate layer 106, however, is not limited to polysilicon; the conductive gate layer may include other semiconductive or conductive materials, such as tungsten and aluminum. Following formation of the dielectric and conductive gate layers, opposed sidewall surfaces may be defined by etching portions of the conductive gate layer and the dielectric layer not covered by a patterned photoresist layer using, e.g., a directional plasma etch technique. As depicted in FIG. 5, the gate conductor and the dielectric layer have been selectively etched to form gate dielectric 108 and gate conductor 110 without etching the underlying nitride layer 102. Nitride layer 102 thus serves as an etch stop layer.

Figure 6:
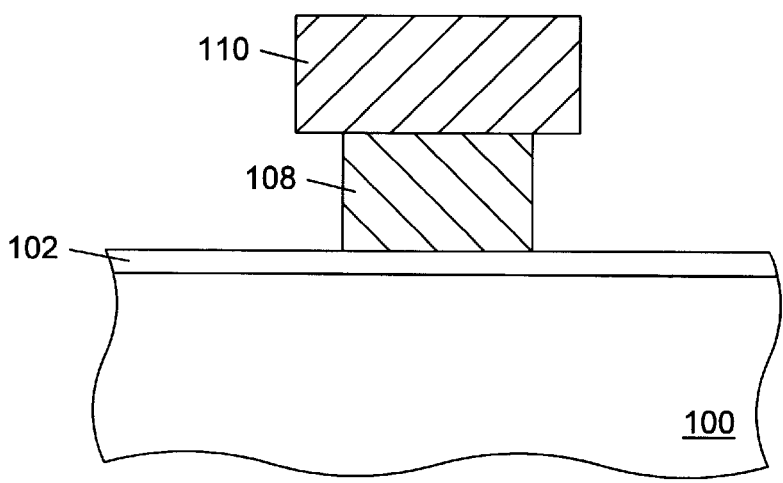
FIG. 6 is a partial cross-sectional view of a semiconductor topography according to a processing step subsequent to FIG. 5, wherein lateral edges of the high-K gate dielectric are isotropically etched to form an undercut beneath the gate conductor.

Following the directional etch, the lateral dimension of gate dielectric 108 may be narrowed using an isotropic etch selective for the gate dielectric material (FIG. 6). Nitride layer 102 may again act as an etch stop layer to protect the underlying semiconductor substrate from damage during etching. Preferably, etching narrows the lateral dimension of gate dielectric 108 by between approximately 10% and 20% of the overall lateral gate dimension on each side (i.e., the lateral dimension of gate dielectric 108 after etching is preferably between approximately 60% and 80% of the lateral dimension of gate conductor 110). The degree of etching may be controlled to allow for scaling of the channel length as desired, facilitating formation of transistors with narrow channels.

Figure 7:
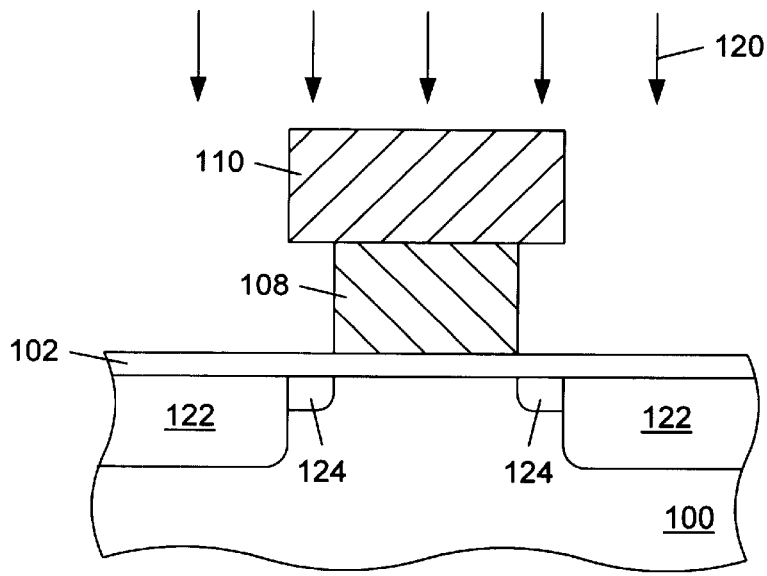
FIG. 7 is a partial cross-sectional view of a semiconductor topography according to a processing step subsequent to FIG. 6, wherein lightly doped drain areas are formed self-aligned with sidewall surfaces of the high-K gate dielectric and source/drain areas are simultaneously formed self-aligned with sidewall surfaces of the gate conductor.

Implant impurity distribution 120 may then be forwarded into selected regions of semiconductor substrate 100 (FIG. 7). Gate dielectric 108 and gate conductor 110 serve as implant masks to block implantation of impurity ions into the channel region underlying the gate. Heavily doped source/drain regions 122 are formed self-aligned with sidewall surfaces of gate conductor 110 at a first depth within semiconductor substrate 100. Gate conductor 110 also serves as a mask to partially block implantation of impurity ions into regions of the semiconductor substrate immediately adjacent sidewall surfaces of gate dielectric 108. As a result, lightly doped drain areas 124 may be formed self-aligned to the sidewalls of gate dielectric 108 at a second depth less than the first depth within regions of substrate 100 laterally adjacent the gate dielectric.

Lightly doped drain areas and source/drain areas are conventionally formed sequentially. Lightly doped drain areas are typically formed self-aligned to sidewall surfaces of the gate conductor by implanting a light concentration of dopant ions into the semiconductor substrate. Dielectric spacers are then formed adjacent the sidewalls of the gate conductor and a second implant of dopant species forwarded into the semiconductor substrate to form source/drain areas a lateral spaced distance from the gate conductor. The second implant is performed at a higher concentration than the first implant. The second implant is also performed at a higher energy than the first implantation, so that the peak concentration of the source/drain areas resides at a depth greater than the peak concentration of the lightly doped drain areas.

The method of the present application advantageously forms lightly doped drain areas and source/drain areas simultaneously. Thus, only one implant step is needed, rather than two as is conventional. Further, the need for spacers adjacent the gate conductor sidewalls is eliminated. Elimination of spacer formation and one impurity implant decreases the number of processing steps, thus eliminating opportunities for unfavorable contaminants to be introduced into the device. In addition, by decreasing the number of fabrication steps, process throughput may be increased and production costs decreased.

Figure 8:
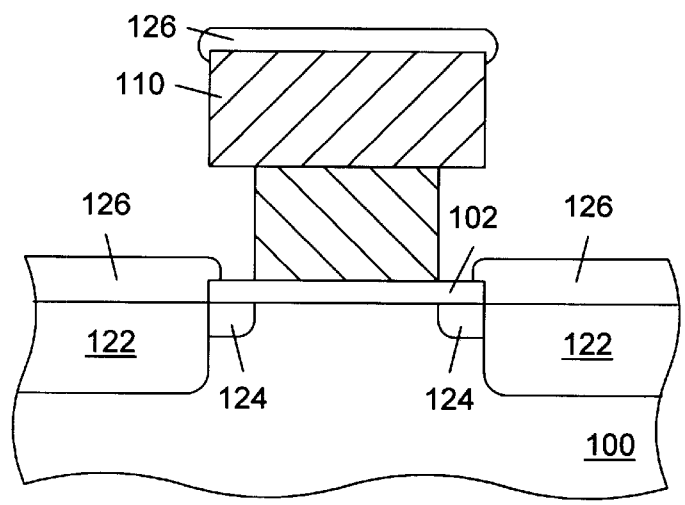
FIG. 8 is a partial cross-sectional view of a semiconductor topography according to a processing step subsequent to FIG. 7, wherein a refractory metal is deposited across upper surfaces of the gate conductor and the source/drain areas.

Following formation of source/drain areas 122 and lightly doped drain areas 124, nitride layer 102 may be removed from surfaces of source/drain areas 122 using a directional plasma etch. Gate conductor 110 may act as a mask, such that nitride 102 is retained on upper surfaces of lightly doped drain areas 124. A refractory metal (e.g., titanium or cobalt) may then be formed across upper surfaces of source/drain regions 122 and the upper surface of gate conductor 110, as shown in FIG. 8. Refractory metal 126 may be sputter deposited from a metal target such that it travels in a direction substantially perpendicular to horizontally oriented features. Sidewall spacers, such as spacers 16 of FIG. 3, typically serve to prevent depositing of refractor metal upon the underlying lightly doped drain areas. In the present invention, however, the portions of gate conductor 110 extending laterally beyond gate dielectric 108 mask the underlying lightly doped drain regions such that substantially no metal is deposited on LDD areas 124 or the sidewalls of gate dielectric 108.

Figure 9:
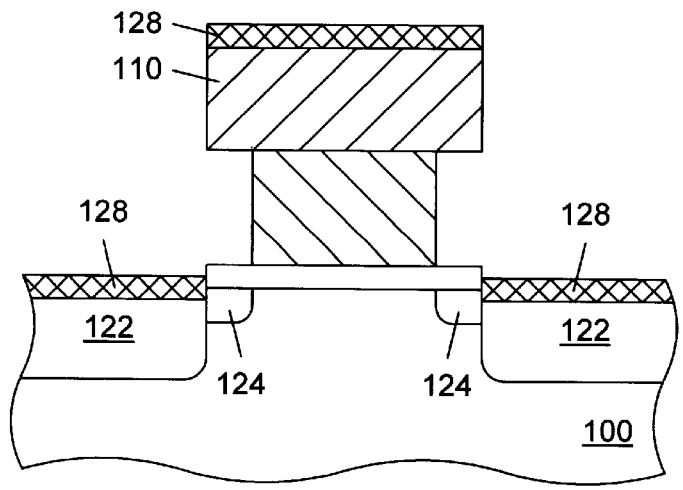
FIG. 9 is a partial cross-sectional view of a semiconductor topography according to a processing step subsequent to FIG. 8, wherein a metal silicide layer is formed across the gate conductor and the source/drain areas.

The deposited refractory metal may be exposed to a form of radiation capable of increasing the temperature of the refractory metal to above, e.g., 600° C. The radiation may be thermal radiation provided from a heated furnace. Alternately, the radiation may be radiant light supplied from, e.g., an arc lamp or a tungsten-halogen lamp using a technique known as rapid thermal processing ("RTP"). The use of RTP to heat the refractory metal may reduce the amount of unwanted dopant diffusion into the semiconductor topography as compared to using a high-temperature furnace. Raising the temperature of the refractory metal serves to initiate reaction between metal atoms and silicon atoms of polysilicon gate conductor 110 and source/drain areas 122. Any unreacted refractory metal which remains may be etched away using, e.g., a wet etch highly selective to the metal. The resulting metal silicide 128 (FIG. 9) has a relatively low resistivity and serves as a self-aligned contact region across source/drain areas 122 and gate conductor 110. Because gate conductor 110 shields the lightly doped drain areas from deposited refractory metal, silicide bridging between gate conductor 110 and source/drain areas 122 is unlikely to occur.

It will be appreciated to those skilled in the art having the benefit of this disclosure that this invention is believed to provide a method for forming self-aligned spacers of small geometries. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor comprising:

an etch-stop layer formed across a semiconductor substrate;

a high-K gate dielectric formed above the etch-stop layer;

a gate conductor formed above the gate dielectric;

lightly doped drain regions self-aligned with sidewall surfaces of the gate dielectric; and source/drain regions self-aligned with sidewall surfaces of the gate conductor.

2. The transistor of claim 1, wherein the etch-stop layer comprises a layer of silicon nitride having a thickness between about 5 angstroms and about 10 angstroms.

3. The transistor of claim 1, wherein the gate dielectric has a lateral thickness of between about 60% and about 80% of a lateral thickness of the gate conductor.

4. The transistor of claim 1, wherein the gate dielectric has a dielectric constant of greater than about 3.8.

5. The transistor of claim 1, wherein the gate dielectric comprises a material selected from the group consisting of tantalum oxide, cerium oxide, tin oxide, barium strontium titanate, lead lanthanum zirconate titanate, and barium zirconate titanate.

6. The transistor of claim 1, wherein the gate conductor comprises polysilicon.

7. The transistor of claim 6, further comprising metal silicide formed on upper surfaces of the gate conductor and the source/drain areas.

* * * * *